United States Patent [19]

Saitoh

[11] Patent Number: 4,569,892

[45] Date of Patent: Feb. 11, 1986

[54] PHOTOCONDUCTIVE MEMBER WITH AMORPHOUS SILICON GERMANIUM REGIONS AND CONTAINING OXYGEN

[75] Inventor: Keishi Saitoh, Ibaraki, Japan

[73] Assignee: Canon Kabushiki Kaisha, Tokyo, Japan

[21] Appl. No.: 641,737

[22] Filed: Aug. 17, 1984

[30] Foreign Application Priority Data

Aug. 23, 1983 [JP] Japan .................. 58-153671

[51] Int. Cl.$^4$ .................. G03G 5/02; G03G 5/08
[52] U.S. Cl. .................. 430/57; 430/84; 430/95
[58] Field of Search .................. 430/57, 84, 85, 95

[56] References Cited

U.S. PATENT DOCUMENTS

| | | | |
|---|---|---|---|
| 4,414,319 | 11/1983 | Shirai et al. | 430/95 |
| 4,471,042 | 9/1984 | Komatsu et al. | 430/95 |
| 4,490,450 | 12/1984 | Shimizu et al. | 430/57 |

Primary Examiner—John L. Goodrow
Attorney, Agent, or Firm—Fitzpatrick, Cella, Harper & Scinto

[57] ABSTRACT

A photoconductive member comprises a support for photoconductive member and a light-receiving layer provided on said support having a layer constitution in which a layer region (G) comprising an amorphous material containing germanium atoms and a layer region (S) exhibiting photoconductivity comprising an amorphous material containing silicon atoms are successively provided from the support side, said light-receiving layer having a first layer region (1), a third layer region (3) and a second layer region (2), each containing oxygen atoms, with the distribution concentrations in the layer thickness direction of C(1), C(3) and C(2), respectively, in the order mentioned from the support side, provided that when C(3) cannot be solely the maximum, and either one of C(1) and C(2) is 0, the other two are not 0 and not equal, or when C(3) is 0, the other two are not 0.

33 Claims, 19 Drawing Figures

PHOTOCONDUCTIVE MEMBER WITH AMORPHOUS SILICON GERMANIUM REGIONS AND CONTAINING OXYGEN

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays and gamma-rays].

2. Description of the Prior Art

Photoconductive materials for constituting photoconductive layers in solid state image pick-up devices, image forming members for electrophotography in the field of image formation, or manuscript reading devices, are required to have a high sensitivity, a high SN ratio [photocurrent $(I_p)$/dark current $(I_d)$], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrphotography to be assembled in an electrophotographic device to be used in an office as office apparatus, the aforesaid safety characteristic is very important.

From the standpoint as mentioned above, amorphous silicon [hereinafter referred to as a-Si] has recently attracted attention as a photoconductive material. For example, German OLS Nos. 2746967 and 2855718 disclose applications of a-Si for use in image forming members for electrophotography, and German OLS No. 2933411 discloses an application of a-Si for use in a photoelectric transducing reading device.

However, under the present situation, the photoconductive members of the prior art having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused, various inconveniences such as accumulation of fatigue by repeated uses or so called ghost phenomenon wherein residual images are formed.

Further, a-Si has a relatively smaller coefficient of absorption of the light on the longer wavelength side in the visible light region as compared with that on the shorter wavelength side. Accordingly, in matching to the semiconductor laser commercially applied at the present time, the light on the longer wavelength side cannot effectively be utilized, when employing a halogen lamp or a fluorescent lamp as the light source. Thus, various points remain to be improved.

On the other hand, when the light irradiated is not sufficiently absorbed in the photoconductive layer, but the amount of the light reaching the support is increased, interference due to multiple reflection may occur in the photoconductive layer to become a cause for "unfocused" image, in the case when the support itself has a high reflectance for the light transmitted through the photoconductive layer.

This effect will be increased, if the irradiated spot is made smaller for the purpose of enhancing resolution, thus posing a great problem in the case of using a semiconductor laser as the light source.

Accordingly, while attempting to improve the characteristics of a-Si material per se on one hand, it is also required to make efforts to overcome all the problems as mentioned above in designing of the photoconductive member on the other hand.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution comprising a light-receiving layer exhibiting photoconductivity, which comprises an amorphous material containing at least one of hydrogen atom (H) and halogen atom (X) in a matrix of silicon atoms, such as so called hydrogenated amorphous silicon, halogenated amorphous silicon, or halogen-containing hydrogenated amorphous silicon [hereinafter referred to comprehensively as a-Si(H,X)], said photoconductive member being prepared by designing so as to have a specific structure as hereinafter described, not only exhibits commercially excellent characteristics but also surpasses the photoconductive members of the prior art in substantially all respects, especially having markedly excellent characteristics as a photoconductive member for electrophotography and also excellent absorption spectrum characteristics on the longer wavelength side.

SUMMARY OF THE INVENTION

A primary object of the present invention is to provide a photoconductive member having electrical, optical and photoconductive characteristics which are constantly stable and all-environment type with virtually no dependence on the environment in use, which member is markedly excellent in photosensitive characteristics on the longer wavelength side and light fatigue resistance and also excellent in durability without causing deterioration phenomenon when used repeatedly, exhibiting no or substantially no residual potential observed.

Another object of the present invention is to provide a photoconductive member which is high in photosensitivity throughout the whole visible light region, particularly excellent in matching to a semiconductor laser and also rapid in light response.

A further object of the present invention is to provide a photoconductive member having sufficient charge retentivity during charging treatment for formation of electrostatic images to the extent such that a conventional electrophotographic method can be very effectively applied when it is provided for use as an image forming member for electrophotography.

Still another object of the present invention is to provide a photoconductive member for electrophotography, which can easily provide an image of high quality which is high in density, clear in halftone and high in resolution.

A still further object of the present invention is to provide a photoconductive member having high photosensitivity and high SN ratio characteristic.

According to the present invention, there is provided a photoconductive member comprising a support for photoconductive member and a light-receiving layer provided on said support having a layer constitution in which a layer region (G) comprising an amorphous material containing germanium atoms and a layer region (S) exhibiting photoconductivity comprising an amorphous material containing silicon atoms are successively provided from the support side, said light-receiving layer having a first layer region (1), a third layer region (3) and a second layer region (2), each containing oxygen atoms, with the distributed concentrations in the layer thickness direction of C(1), C(3) and C(2), respectively, in the order mentioned from the support side, provided that when C(3) cannot be solely the maximum, and either one of C(1) and C(2) is 0, the other two are not 0 and not equal; when C(3) is 0, the other two are not 0; or when none of C(1), C(2) and C(3) is zero, C(1), C(2) and C(3) are not equal simultaneously and C(3) is not solely the maximum.

DETAILED DESCRIPTION OF THE PREFERRED EMBODIMENTS

Referring now to the drawings, the photoconductive members according to the present invention are to be described in detail below.

Figure 1:
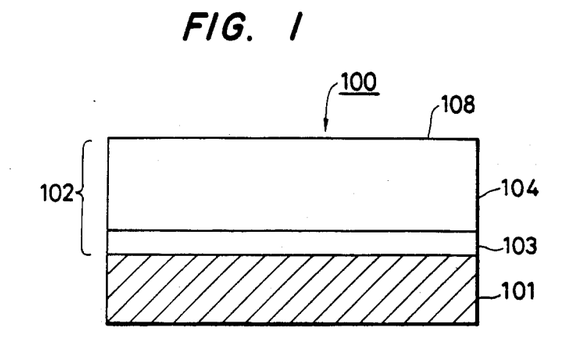
FIG. 1 shows a schematic sectional view for illustration of the layer constitution of the photoconductive member according to the present invention.

FIG. 1 shows a schematic sectional view for illustration of the layer structure of a first embodiment of the photoconductive member of this invention.

The photoconductive member 100 as shown in FIG. 1 comprises a light-receiving layer 102 formed on a support 101 for photoconductive member, said light-receiving layer having a free surface 105 on one end surface.

The light-receiving layer 102 has a layer structure constituted of a layer region (G) 103 comprising an amorphous material containing germanium atoms and, if desired, at least one of silicon atoms, hydrogen atoms and halogen atoms (X) [hereinafter abbreviated as "a-Ge(Si,H,X)"] and a layer region (S) 104 having photoconductivity and comprising a-Si which may contain at least one of hydrogen atoms or halogen atoms, if desired (hereinafter abbreviated as "a-Si(H,X))" laminated successively from the support side 101.

The germanium atoms contained in the layer region (G) 103 may be contained in said layer region (G) so that they are distributed continuously in the layer thickness direction through said layer region (G) 103 and more enriched on the support side 101 than on the side opposite to the side where the support 101 is provided (the surface side 105 of the light-receiving layer 102), or alternatively in a distribution contrary thereto, or evenly throughout the layer region (G).

In the photoconductive member of the present invention, when the distribution of germanium atoms contained in the layer region (G) is ununiform, it is desirable that they should take such a distribution as mentioned above in the layer thickness direction, while a uniform distribution within the plane parallel to the surface of the support.

In the present invention, in the layer region (S) provided on the layer region (G), no germanium atom is contained, and by forming the light-receiving layer to such a layer structure, it is possible to give a photoconductive member which is excellent in photosensitivity to the light over the entire wavelength region from relatively shorter wavelength to relatively longer wavelength.

Also, in a preferred embodiment in the case of a system where germanium atoms are ununiformly distributed, since the distribution of germanium atoms in the layer region (G) is varied such that germanium atoms are distributed continuously over all the layer region with the concentration C of germanium atoms in the layer thickness direction being reduced from the support side to the layer region (S), affinity between the layer region (G) and the layer region (S) is excellent. Also, as described hereinafter, by increasing the concentration C of germanium atoms at the end portion on the support side extremely great, the light on the longer wavelength side which cannot substantially be absorbed by the second layer region (S) can be absorbed in the layer region (G) substantially completely, when employing a semiconductor laser, whereby interference by reflection from the support surface can be prevented.

Also, in the photoconductive member of the present invention, the respective amorphous materials constituting the layer region (G) and the layer region (S) have the common constitutent of silicon atoms, and therefore chemical stability can be sufficiently ensured at the laminated interface.

FIGS. 2 through 10 show typical examples of distribution in the direction of layer thickness of germanium atoms contained in the layer region (G) of the photoconductive member in the present invention.

In FIGS. 2 through 10, the abscissa indicates the content C of germanium atoms and the ordinate the layer thickness of the layer region (G), $t_B$ showing the position of the end surface of the layer region (G) on the support side and $t_T$ the position of the end surface of the layer region (G) on the side opposite to the support side. That is, layer formation of the layer region (G) containing germanium proceeds from the $t_B$ side toward the $t_T$ side.

Figure 2:
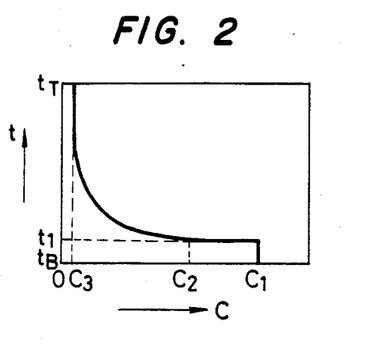
FIGS. 2 to 10 each shows a schematic illustration of the depth profiles of germanium in the light-receiving layer.

In FIG. 2, there is shown a first typical embodiment of the depth profile of germanium atoms in the layer thickness direction contained in the layer region (G).

In the embodiment as shown in FIG. 2, from the interface position $t_B$ at which the surface, on which the layer region (G) containing germanium atoms is to be formed, is contacted with the surface of said layer region (G) to the position $t_1$, germanium atoms are contained in the layer region (G) formed, while the concentration C of germanium atoms taking a constant value of $C_1$, the concentration being gradually decreased from the concentration $C_2$ continuously from the position $t_1$ to the interface position $t_T$. At the interface position $t_T$, the concentration C of germanium atoms is made $C_3$.

Figure 3:
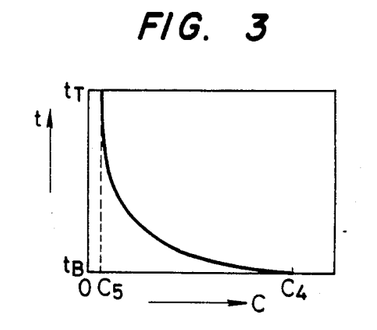

In the embodiment shown in FIG. 3, the concentration C of germanium atoms contained is decreased gradually and continuously from the position $t_B$ to the position $t_T$ from the concentration $C_4$ until it becomes the concentration $C_5$ at the position $t_T$.

Figure 4:
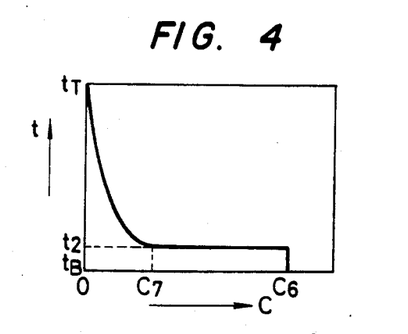

In case of FIG. 4, the concentration C of germanium atoms is made constant as $C_6$ from the position $t_B$ to the position $t_2$, gradually decreased continuously from the position $t_2$ to the position $t_T$, and the concentration C is made substantially zero at the position $t_T$ (substantially zero herein means the content less than the detectable limit).

Figure 5:
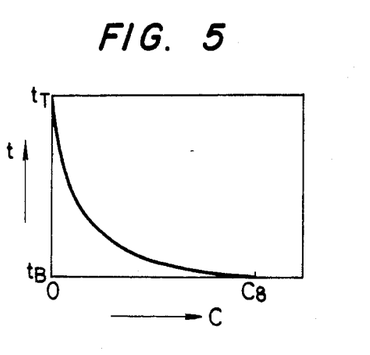

In case of FIG. 5, germanium atoms are decreased gradually and continuously from the position $t_B$ to the position $t_T$ from the concentration $C_8$, until it is made substantially zero at the position $t_T$.

Figure 6:
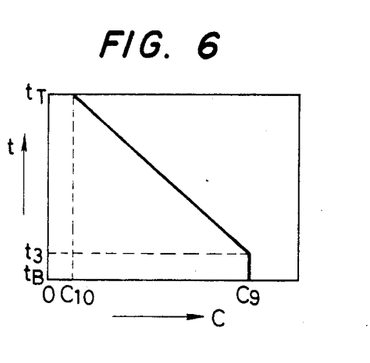

In the embodiment shown in FIG. 6, the concentration C of germanium atoms is constantly $C_9$ between the position $t_B$ and the position $t_3$, and it is made $C_{10}$ at the position $t_T$. Between the position $t_3$ and the position $t_T$, the concentration C is decreased as a first order function from the position $t_3$ to the position $t_T$.

Figure 7:
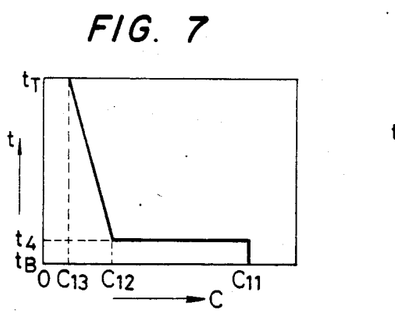

In the embodiment shown in FIG. 7, there is formed a depth profile such that the concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 8:
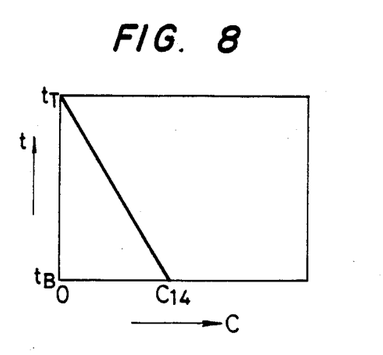

In the embodiment shown in FIG. 8, the concentration C of germanium atoms is decreased as a first order function from the concentration $C_{14}$ to zero from the position $t_B$ to the position $t_T$.

Figure 9:
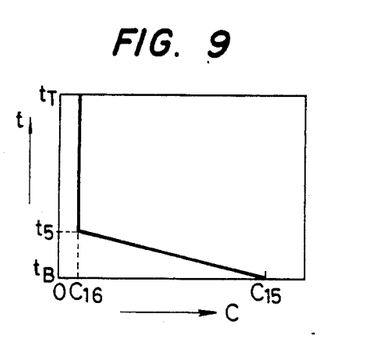

In FIG. 9, there is shown an embodiment, where the concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 10:
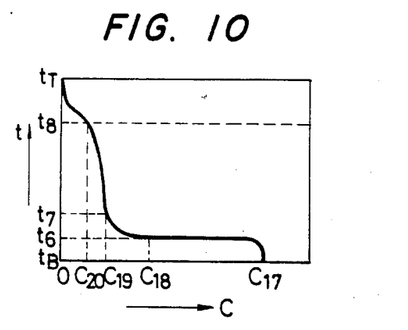

In the embodiment shown in FIG. 10, the concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the layer region (G) in the direction of the layer thickness by referring to FIGS. 2 through 10, in the present invention, the layer region (G) is provided desirably in a depth profile so as to have a portion enriched in concentration C of germanium atoms on the support side and a portion depleted in concentration C of germanium atoms to considerably lower than that of the support side on the interface $t_T$ side.

The layer region (G) constituting the light-receiving layer of the photoconductive member in the present invention is desired to have a localized region (A) containing germanium atoms preferably at a relatively higher concentration on the support side as a described above.

In the present invention, the localized region (A), as explained in terms of the symbols shown in FIG. 2 through FIG. 10, may be desirably provided within 5 $\mu$ from the interface position $t_B$.

In the present invention, the above localized region (A) may be made to be identical with the whole layer region ($L_T$) from the interface position $t_B$ to the thickness of 5 $\mu$, or alternatively a part of the layer region ($L_T$).

It may suitably be determined depending on the characteristics required for the amorphous layer to be formed, whether the localized region (A) is made a part or whole of the layer region ($L_T$).

The localized region (A) may preferably be formed according to such a layer formation that the maximum value Cmax of the concentration of germanium atoms in a distribution in the layer thickness direction may preferably be 1000 atomic ppm or more, more preferably 5000 atomic ppm or more, most preferably $1 \times 10^4$ atomic ppm or more based on the sum of silicon and germanium atoms.

That is, according to the present invention, the layer region (G) containing germanium atoms is formed so that the maximum value Cmax of the depth profile may exist within a layer thickness of 5 $\mu$ from the support side (the layer region within 5 $\mu$ thickness from $t_B$).

In the present invention, the content of germanium atoms in the layer region (G), which may suitably be determined as desired so as to achieve effectively the objects of the present invention, may preferably be 1 to $10 \times 10^5$ atomic ppm, more preferably 100 to $9.5 \times 10^5$ atomic ppm, most preferably 500 to $8 \times 10^5$ atomic ppm based on the sum of silicon and germanium atoms.

In the photoconductive member of the present invention, the layer thickness of the layer region (G) and the thickness of the layer region (S) are one of important factors for accomplishing effectively the object of the present invention and therefore sufficient care should be paid in designing of the photoconductive member so that desirable characteristics may be imparted to the photoconductive member formed.

In the present invention, the layer thickness $T_B$ of the layer region (G) may preferably be 30 Å to 50 $\mu$, more preferably 40 Å to 40 $\mu$, most preferably 50 Å to 30 $\mu$.

On the other hand, the layer thickness T of the layer region (S) may be preferably 0.5 to 90 $\mu$, more preferably 1 to 80 $\mu$, most preferably 2 to 50 $\mu$.

The sum of the above layer thickness T and $T_B$, namely ($T+T_B$) may be suitably determined as desired in designing of the layers of the photoconductive member, based on the mutual organic relationship between the characteristics required for both layer regions and the characteristics required for the whole light-receiving layer.

In the photoconductive member of the present invention, the numerical range for the above ($T_B+T$) may generally be from 1 to 100 $\mu$, preferably 1 to 80 $\mu$, most preferably 2 to 50 $\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that more preferably, the relation $T_B/T \leq 0.9$, most preferably $T_B/T \leq 0.8$, may be satisfied.

In the present invention, when the content of germanium atoms in the layer region (G) is $1 \times 10^5$ atomic ppm or more, the layer thickness $T_B$ should desirably be made as thin as possible, preferably 30 μ or less, more preferably 25 μ or less, most preferably 20 μ or less.

In the present invention, illustrative of halogen atoms (X), which may optionally be incoporated in the layer region (G) and the layer region (S) constituting the light-receiving layer, are fluorine, chlorine, bromine and iodine, particularly preferably fluorine and chlorine.

In the present invention, formation of the layer region (G) comprising a-Ge(Si,H,X) may be conducted according to the vacuum deposition method utilizing discharging phenomenon, such as glow discharge method, sputtering method or ion-plating method. For example, for formation of the layer region (G) constituted of a-Ge(Si,H,X) according to the glow discharge method, the basic procedure comprises introducing a starting gas for Ge supply capable of supplying germanium atoms (Ge) optionally together with a starting gas for Si supply capable of supplying silicon atoms (Si), and a starting gas for introduction of hydrogen atoms (H) and/or a starting gas for introduction of halogen atoms (X) into a deposition chamber which can be internally brought to a reduced pressure, and exciting glow discharge in said deposition chamber, thereby forming a layer consisting of a-Ge(Si,H,X) on the surface of a support set at a predetermined position while controlling the depth profile of germanium atoms according to a desired change rate curve. Alternatively, for formation according to the sputtering method, when carrying out sputtering by use of two sheets of a target constituted of Si and a target constituted of Ge, or a target of a mixture of Si and Ge in an atmosphere of an inert gas such as Ar, He, etc. or a gas mixture based on these gases, if desired, a gas for introduction of hydrogen atoms (H) and/or halogen atoms (X) may be introduced into a deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substances which can be starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during layer formation and efficiency for supplying Ge.

Effective starting gases for introduction of halogen atoms to be used in the present invention may include a large number of halogen compounds, preferably gaseous or gasifiable halogen compounds, as exemplified by halogenic gases, halides, interhalogen compounds, or silane derivatives substituted with halogen.

Further, there may also be included gaseous or gasifiable hydrogenated silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogen, there may preferably be employed halogenated silicons such as $SiF_4$, $Si_2F_6$, $SiCl_4$, $SiBr_4$ and the like.

When the characteristic photoconductive member of the present invention is formed according to the glow discharge method by employment of such a silicon compound containing halogen atoms, it is possible to form the layer region (G) containing halogen atoms on a desired support without use of a hydrogenated silicon gas as the starting gas capable of supplying Si together with the starting gas for Ge supply.

In the case of forming the layer region (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He etc. at a predetermined mixing ratio into the deposition chamber for formation of the layer region (G) and exciting glow discharge to form a plasma atmosphere of these gases, whereby the layer region (G) can be formed on a desired support. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

For formation of the layer region (G) comprising a Ge-(Si,H,X) according to the reactive sputtering method or ion-plating method, for example, in the case of the sputtering method, two sheets of a target comprising Si and a target comprising Ge or a target comprising Si and Ge may be subjected to sputtering in a desired gas plasma atmosphere; while in the case of the ion-plating method, for example, a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere.

In either case of the sputtering method and the ion-plating method, introduction of halogen atoms into the layer formed may be performed by introducing the gas of the above halogen compound or the above silicon compound containing halogen atoms into a deposition and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halogen compounds or halo-containing silicon compounds as mentioned above can effectively be used. Otherwise, it is also possible to use effectively as the starting material for formation of the layer region (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $SiH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogen, because hydrogen atoms, which are very effective for controlling electrical or photoelectric characteristics, can be introduced into the layer simultaneously with introduction of halogen atoms during formation of the layer region (G).

For introducing hydrogen atoms structurally into the layer region (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc., silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the layer region (G) to be formed should preferably be 0.01 to 40 atomic %, more preferably 0.05 to 30 atomic %, more preferably 0.1 to 25 atomic %.

For controlling the amount of hydrogen atoms (H) and/or halogen atoms (X) to be contained in the layer region (G), for example, the support temperature and/or the amount of the starting materials used for incorporation of hydrogen atoms (H) or halogen atoms (X) to be introduced into the deposition device system, discharging power, etc. may be controlled.

In the present invention, for formation of the layer region (S) constituted of a-Si(H,X), the starting materials (I) for formation of the layer region (G) as mentioned above, from which the starting material for the starting gas for supplying Ge is omitted, are used as the starting materials (II) for formation of the layer region (S), and layer formation can be effected following the same procedure and conditions as in formation of the layer region (G).

More specifically, in the present invention, formation of the layer region (S) constituted of a-S(H,X) may be carried out according to the vacuum deposition method utilizing discharging phenomenon such as the glow discharge method, the sputtering method or the ion-plating method. For example, for formation of the layer region (S) constituted of a-Si(H,X) according to the glow discharge method, the basic procedure comprises introducing a starting gas for Si supply capable of supplying silicon atoms as described above, optionally together with starting gases for introduction of hydrogen atoms (H) and/or halogen atoms (X) into a deposition chamber which can be brought internally to a reduced pressure and exciting glow discharge in said deposition chamber, thereby forming a layer comprising a-Si(H,X) on a desired support placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an atmosphere of inert gas such as Ar, He, etc. or a gas mixture based on these gases.

In the photoconductive member of the present invention, a substance (C) for controlling conductivity can also be incorporated in the layer region (G) containing germanium atoms and/or the layer region (S) containing no germanium atom, whereby the conductivity of said layer region (G) and/or said layer region (S) can be freely controlled.

As a substance (C) for controlling conductivity, there may be mentioned so called impurities in the field of semiconductors. In the present invention, there may be included p-type impurities giving p-type conductivity and n-type impurities giving n-type conductivity to Si or Ge constituting the layer region (PN) containing a substance (C).

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) may be suitably selected depending on the conductivity required for said layer region (PN), or characteristics of other layer regions provided in direct contact with said layer region, the organic relationships such as relation with the characteristics of said other layers or the support at the contacted interface, etc.

When the above substance for controlling conductivity is to be incorporated in the light-receiving layer locally at the desired layer region of said light-receiving layer, particularly at an end portion layer region (E) on the support side of the light-receiving layer, the content of the substance for controlling conductivity characteristics is determined suitably with due considerations of the relationships with characteristics of other layer regions provided in direct contact with said layer region (E) or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention when the content of said substance (C) in the layer region (PN) is preferably 30 atomic ppm or more, more preferably 50 atomic ppm or more, most preferably 100 atomic ppm or more, the substance (C) is desired to be contained locally at a part of the layer region of the light-receiving layer, particularly localized at the end portion layer region (E) on the support side of the light-receiving layer.

In the above constitution, by incorporating the substance (C) for controlling conductivity in the end portion layer region (E) on the support side of the light-receiving layer so that the content may be the above value or higher, for example, in the case when said substance (C) to be incorporated is a p-type impurity as mentioned above, migration of electrons injected from the support side into the light-receiving layer can be effectively inhibited when the free surface of the light-receiving layer is subjected to the charging treatment to ⊕ polarity. On the other hand, when the substance to be incorporated is a n-type impurity, migration of positive holes injected from the support side into the light-receiving layer can be effectively inhibited when the free surface of the light-receiving layer is subjected to the charging treatment to ⊖ polarity.

Thus, in the case when a substance for controlling conductivity of one polarity is incorporated in the aforesaid end portion layer region (E), the residual layer region of the light-receiving layer, namely the layer region (Z) excluding the aforesaid end portion layer region (E) may contain a substance for controlling conductivity of the other polarity, or a substance for controllong conductivity of the same polarity may be contained therein in an amount by far smaller than that practically contained in the end portion layer region (E).

In such a case, the content of the substance (C) for controlling conductivity contained in the above layer region (Z) can be determined adquately as desired dpending on the polarity of the substance contained in the end portion layer region (E), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the end portion layer region (E) and the layer region (Z), the content in the layer region (Z) should preferably be 30 atomic ppm or less. As different from the cases as mentioned above, in the present invention, it is also possible to provide in the light-receiving layer, a layer region containing a substrate for controlling conductivity having one polarity and a layer region containing substance for controlling conductivity having the other polarity in direct contact with each other, thus providing a so called depletion layer at said contact region. In short, for example, a layer containing the aforesaid p-type impurity and a layer region containing the aforesaid n-type impurity are provided in the light-receiving layer in direct contact with each other to form the so called p-n junction, whereby a depletion layer can be provided.

For incorporating a substance (C) for controlling conductivity such as the group III atoms or the group V atoms structurally into the light-receiving layer, a starting material for introduction of the group III atoms or a starting material for introduction of the group V atoms may be introduced under gaseous state into a deposition chamber together with the starting materials for formation of the second layer region during layer formation. As the starting material which can be used for introduction of the group III atoms, it is desirable to use those which are gaseous at room temperature under atmospheric pressure or can readily be gasified under layer forming conditions. As typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydride such as $PH_3$, $P_2H_4$, etc., phosphorus halides such as $PH_4I$, $PF_3$, $PF_5$, $PCl_3$, $PCl_5$, $PBr_3$, $PI_3$ and the like. Otherwise, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like effectively as the starting material for introduction of the group V atoms.

In the present invention, the amount of hydrogen atoms (H) or the amount of halogen atoms (X) or the sum of the amounts of hydrogen atoms and halogen atoms (H+X) to be contained in the layer region (S) constituting the light-receiving layer to be formed should preferably be 1 to 40 atomic %, more preferably 5 to 30 atomic %, most preferably 5 to 25 atomic %.

In the photoconductive member of the present invention, for the purpose of improvements to higher photosensitivity, higher dark resistance and, further, improvement of adhesion between the support and the light-receiving layer, a layer region (0) containing oxygen atoms is provided in the light-receiving layer. The oxygen atoms contained in the light-receiving layer may be contained either evenly throughout the whole layer region of the light-receiving layer or locally only in a part of the layer region of the light-receving layer.

In the present invention, the distribution concentration of oxygen atoms, C(0), through the whole light-receiving layer is ununiform stepwise in the layer thickness direction.

Figure 11:
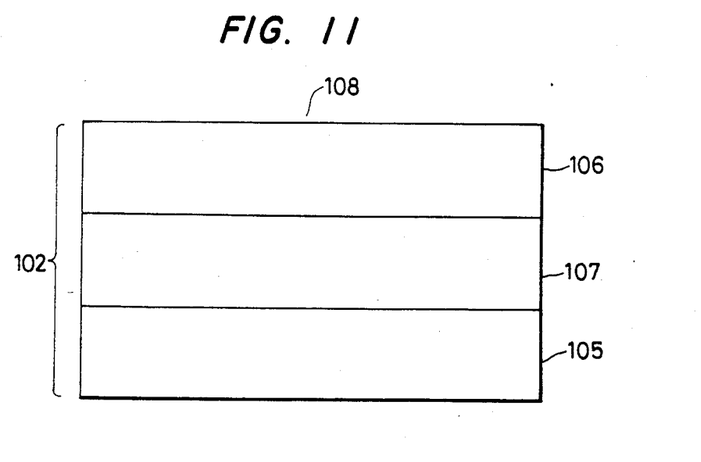
FIG. 11 is a schematic sectional view for illustration of the constitution of a light-receiving layer.

As shown in FIG. 11, the light-receiving layer 102 of the photoconductive member 100 shown in FIG. 1 contains oxygen atoms, and has a first layer region (1) 105 with a distribution concentration in the layer thickness direction of a value C(1), a second layer region (2) 106 with a distribution concentration of a value C(2) and a third layer region (3) 107 with a distribution concentration of a value C(3). Also, the contacted interface between the layer region (G)103 and the layer region (S) 104 may exist in any of the first, second and third layer regions.

In the present invention, it is not necessarily required that oxygen atoms should be contained in all of the three layer regions of the above first, second and third layer regions. However, when no oxygen atom is contained in either one of the layer regions, oxygen atoms are necessarily contained in the other two layer regions, and the distribution concentrations in the layer thickness direction are required to be different in those layer regions and the distribution concentration in the third layer region should not be solely the maximum.

In other words, when either one of C(1), C(2) and C(3) is zero (0), the respective layer regions are required to be formed so that the other two are not zero (0) and not equal to each other and C(3) is not solely the maximum. When each of the first, second and third layer regions contains oxygen atoms, the distribution concentrations of the three layer regions are not equal simultaneously and the distribution concentration of the third layer region is not solely the maximum. Oxygen atoms are contained in the layer regions in such a way as mentioned above. In other words, when none of C(1), C(2) and C(3) is zero, C(1), C(2) and C(3) are not equal simultaneously and C(3) is not solely the maximum. By doing so, when charging treatment is applied, injection of charges from the side of the free surface 108 or the side of the support 101 into the light-receiving layer 102 can effectively be inhibited, and at the same time improvement of dark resistance of the light-receiving layer 102 itself as well as improvement of adhesion between the support 101 and the light-receiving layer 102 can be effected. In order that the light-receiving layer 102 may have practically satisfactory photosensitivity and dark resistance and injection of charges into the light-receiving layer 102 may be sufficiently inhibited, and also that transport of the photocarriers generated in the light-receiving layer 102 effectively done, it is necessary to design the light-receiving layer 102 so that the distribution concentration C(3) of oxygen atoms in the third layer region (3) may not be solely the maximum.

In this case, preferably, the layer thickness of the third layer region is desired to be sufficiently thicker than the layer thicknesses of the other two layer regions. More preferably, the light-receiving layer 102 should desirably be designed so that the layer thickness of the third layer (3) may comprise at least 1/5 of the layer thickness of the light-receiving layer 102.

In the present invention, the layer thickness of the first layer region (1) and the second layer region (2) should preferably be 0.003 to 30μ, more preferably 0.004 to 20μ, most preferably 0.005 to 10μ.

On the other hand, the layer thickness of the third layer region (3) should preferably be 1 to 100μ, more preferably 1 to 80μ, most preferably 2 to 50μ.

When the light-receiving layer is designed so as to impart primarily the function of the so called charge injection inhibiting layer, which inhibits injection of charges into the light-receiving layer, to the first layer region (1) and the second layer region (2), each of the layer thicknesses of the first layer region (1) and the second layer region (2) should desirably be made 10μ at its maximum.

When the light-receiving layer is designed so as to impart primarily the function of charge generating layer to the third layer region (3), the layer thickness of the layer region (3) is determined suitably depending on the absorption coefficient for light of the light source employed. In this case, if a light source conventionally used in the field of electrophotography is to be employed, the layer thickness of the third layer region (3) may be at most about 10μ.

In order to impart primarily the function of charge transport layer to the third layer region (3), its thickness should desirably be at least 5μ.

In the present invention, the maximum value of the distribution concentrations of oxygen atoms C(1), C(2) and C(3) should preferably be 67 atomic % or less, more preferably 50 atomic % or less, most preferably 40 atomic % or less based on the sum of silicon atoms, germanium atoms and oxygen atoms (hereinafter written as "T(SiGeO)").

As the minimum value when the above distribution concentrations C(1), C(2) and C(3) are not 0, it should desirably be 1 atomic ppm or more, more preferably 50 atomic ppm or more, most preferably 100 atomic ppm or more based on T(SiGeO).

In the present invention, oxygen atoms are distributed ununiformly in the layer thickness direction through the whole light-receiving layer, but uniformly in the layer thickness direction in respective regions of the first, second and third layer regions.

FIGS. 12 through 16 show typical examples of depth profiles of oxygen atoms as the whole light-receiving layer. In explanation of these drawings, the symbols used have the same meanings as used in FIG. 2 through 10, unless otherwise noted.

Figure 12:
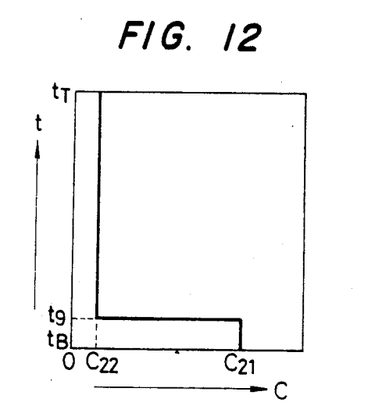
FIGS. 12 to 16 each shows a schematic illustration of the depth profile of oxygen atoms in the light-receiving layer.

In the embodiment shown in FIG. 12, from the position $t_B$ to the position $t_9$, the distribution of oxygen atoms is made constantly at the concentration $C_{21}$, and from the position $t_9$ to $t_T$ constantly at the distribution concentration $C_{22}$.

Figure 13:
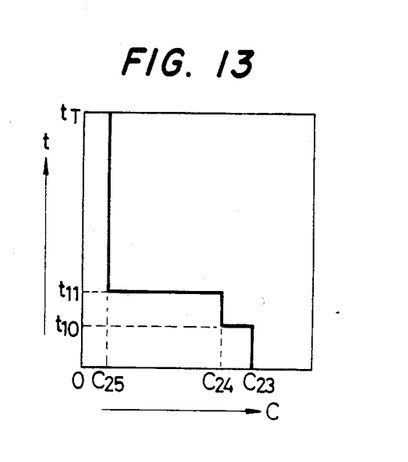

In the embodiment shown in FIG. 13, from the position $t_B$ to the position $t_{10}$, the profile takes a constant value of the distribution concentration $C_{23}$, while it is made the distribution concentration $C_{24}$ from the position $t_{10}$ to the position $t_{11}$ and the distribution concentration $C_{25}$ from the position $t_{11}$ to the position $t_T$. Thus, the distribution concentration of oxygen atoms is reduced in three steps.

Figure 14:
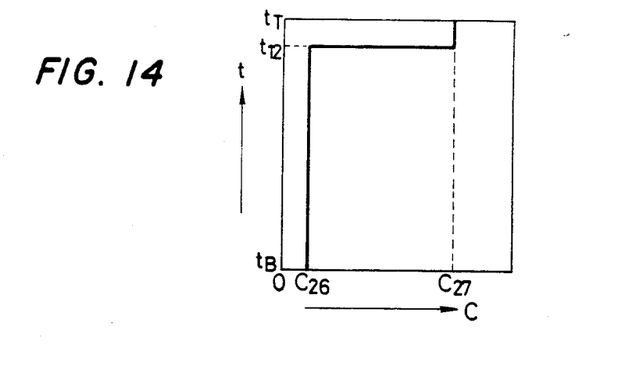

In the embodiment of FIG. 14, the distribution concentration of oxygen atoms is made $C_{26}$ from the position $t_B$ to the position $t_{12}$, while it is made $C_{27}$ from the position $t_{12}$ to the position $t_T$.

Figure 15:
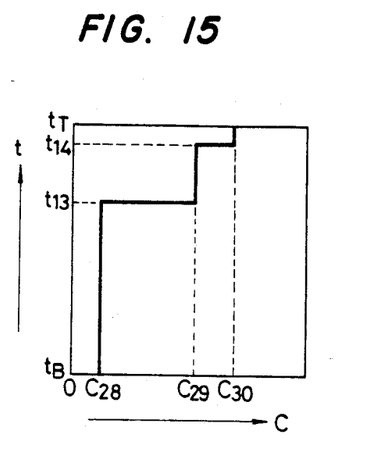

In the embodiment of FIG. 15, the distribution concentration of oxygen atoms is increased in three steps, with the concentration $C_{28}$ from the position $t_B$ to the position $t_{13}$, the concentration $C_{29}$ from the position $t_{13}$ to the position $t_{14}$ and the concentration $C_{30}$ from the position $t_{14}$ to the position $t_T$.

Figure 16:
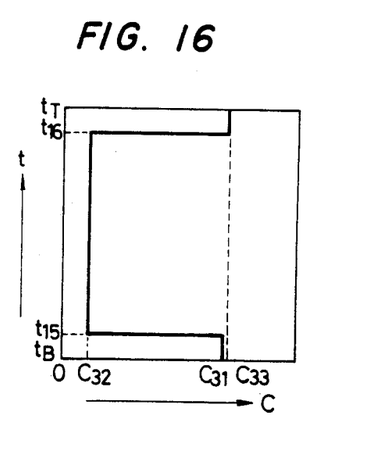

In the embodiment of FIG. 16, the distribution concentration of oxygen atoms is higher on the support side and the free surface side by making the concentration from the position $t_B$ to the position $t_{15}$ as $C_{31}$, that from the position $t_{15}$ to the position $t_{16}$ as $C_{32}$ and that from the position $t_{16}$ to $t_T$ as $C_{33}$.

In the present invention, for provision of the layer region (0) containing oxygen atoms in the light-receiving layer, a starting material for introduction of oxygen atoms may be used together with the starting material for formation of the light-receiving layer as mentioned above during formation of the layer and may be incorporated in the layer while controlling their amounts.

When the glow discharge method is to be employed for formation of the layer region (0), a starting material for introduction of oxygen atoms may be added to the starting material selected as desired from those for formation of the light-receiving layer as mentioned above. As such a starting material for introduction of oxygen atoms, there may be employed most of gaseous or gasifiable substances containing at least oxygen atoms as constituent atoms.

For example, there may be employed a mixture of a starting gas containing silicon atoms (Si) as constituent atoms, a starting gas containing oxygen atoms (O) as constituent atoms and optionally a starting gas containing hydrogen atoms (H) and/or halogen atoms (X) as constituent atoms at a desired mixing ratio; a mixture of a starting gas containing silicon atoms (Si) as constituent atoms and a starting gas containing oxygen atoms (O) and hydrogen atoms (H) as constituent atoms also at a desired mixing ratio; or a mixture of a starting gas containing silicon atoms (Si) as constituent atoms and a starting gas containing the three atoms of silicon atoms (Si), oxygen atoms (O) and hydrogen atoms (H) as constituent atoms.

Alternatively, there may also be employed a mixture of a starting gas containing silicon atoms (Si) and hydrogen atoms (H) as constituent atoms and a starting gas containing oxygen atoms (O) as constituent atoms.

More specifically, there may be mentioned, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane $H_3SiOSiH_3$, trisiloxane $H_3SiOSiH_2OSiH_3$, and the like.

For formation of the layer region (0) containing oxygen atoms according to the sputtering method, a single crystalline or polycrystalline Si wafer or $SiO_2$ wafer or a wafer containing Si and $SiO_2$ mixed therein may be employed, and sputtering may be conducted in various gas atmospheres.

For example, when Si wafer is employed as the target, a starting gas for introduction of oxygen atoms optionally together with a starting gas for introduction of hydrogen atoms and/or halogen atoms, which may optionally be diluted with a diluting gas, may be introduced into a deposition chamber for sputtering to form gas plasma of these gases, in which sputtering of the aforesaid Si wafer may be effected.

Alternatively, by use of separate targets of Si and $SiO_2$ or one sheet of a target containing Si and $SiO_2$ mixed therein, sputtering may be effected in an atmosphere of a diluting gas as a gas for sputtering or in a gas atmosphere containing at least hydrogen atoms (H) and/or halogen atoms (X) as constituent atoms. As the starting gas for introduction of oxygen atoms, there may be employed the starting gases shown as examples in the glow discharge method previously described also as effective gases in case of sputtering.

In the present invention, when providing a layer region (0) containing oxygen atoms during formation of the light recieving layer, formation of the layer region (0) having a desired depth profile in the direction of layer thickness by varying the distribution concentration C(0) of oxygen atoms contained in said layer region (0) may be conducted in case of glow discharge by introducing a starting gas for introduction of oxygen atoms of which the distribution concentration C(0) is to be varied into a deposition chamber, while varying suitably its gas flow rate according to a desired change rate curve.

For example, by the manual method or any other method conventionally used such as an externally driven motor, etc., the opening of certain needle valve provided in the course of the gas flow channel system may be varied stepwise.

In the case when the layer region (0) is formed by the sputtering method, formation of a desired depth profile of oxygen atoms in the direction of layer thickness by varying the distribution concentration C(0) of oxygen atoms in the direction of layer thickness may be performed, first similarly as in case of the glow discharge method, by employing a starting material for introduction of oxygen atoms under gaseous state and varying suitably stepwise the gas flow rate of said gas when introduced into the deposition chamber.

Secondly, formation of such a depth profile can also be achieved by previously changing the composition of a target for sputtering. For example, when a target comprising a mixture of Si and $SiO_2$ is to be used, the mixing ratio of Si to $SiO_2$ may be varied in the direction of layer thickness of the target.

The support to be used in the present invention may be either electroconductive or insulating. As the electroconductive material, there may be mentioned metals such as NiCr, stainless steel, Al, Cr, Mo, Au, Nb, Ta, V, Ti, Pt, Pd etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating supports should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($IN_2O_3+SnO_2$) thereon. Alternatively, a synthetic resin film such as polyester film can be subjected to the electroconductive treatment on its surface by vacuum vapor deposition, electron-beam H) deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is preferably 10 μm or more from the point of fabrication and handling of the support as well as its mechanical strength.

As described in detail above, the photoconductive member designed to have layer constitution of the present invention can overcome all of the problems as mentioned above and exhibit very excellent electrical, optical, photoconductive characteristics, dielectric strength as well as good environmental characteristics in use.

In particular, when it is applied as an image forming member for electrophotography, it is entirely free from influence of residual potential on image formation, being stable in its electrical properties with high sensitivity and having high SN ratio as well as excellent light fatigue resistance and repeated usage characteristics, whereby it is possible to obtain images of high quality with high density, clear halftone and high resolution.

Further, the photoconductive member of the present invention is high in photosensitivity over the all visible light regions, particularly excellent in matching to semiconductor laser and also rapid in light response.

Next, an example of the process for producing the photoconductive member of this invention is to be briefly described.

Figure 17:
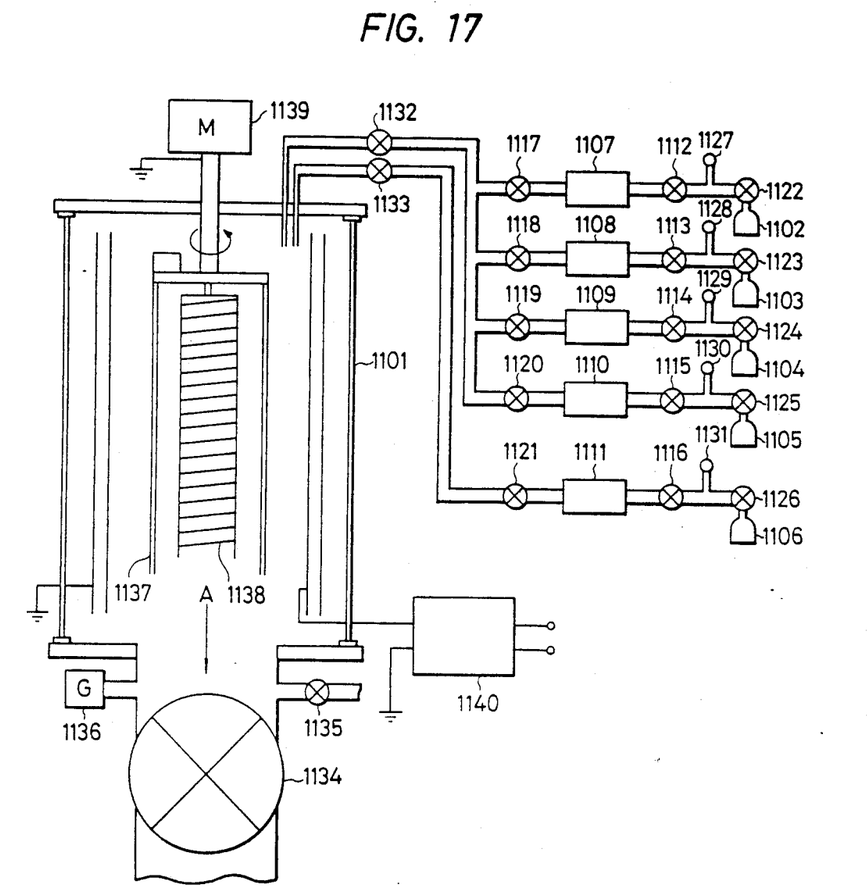
FIG. 17 is a schematic illustration of the device used in the present invnetion.

FIG. 17 shows one example of a device for producing a photoconductive member.

In the gas bombs 1102–1106 there are hermetically contained starting gases for formation of the photoconductive member of the present invention. For example, 1102 is a bomb containing $SiH_4$ gas diluted with He (purity: 99.999%, hereinafter abbreviated as "$SiH_4$/He"), 1103 is a bomb containing $GeH_4$ gas diluted with He (purity: 99.999%, hereinafter abbreviated as "$GeH_4$/He"), 1104 is a NO gas bomb (purity: 99.99%), 1105 is a He gas bomb (purity: 99.999%) and 1106 is a $H_2$ gas bomb (purity: 99.999%).

For allowing these gases to flow into the reaction chamber 1101, on confirmation of the valves 1122–1126 of the gas bombs 1102–1106 and the leak valve 1135 to be closed, and the inflow valves 1112–1116, the outflow valves 1117–1121 and the auxiliary valves 1132, 1133 to be opened, the main valve 1134 is first opened to evacuate the reaction chamber 1101 and the gas pipelines. As the next step, when the reading on the vacuum indicator 1136 becomes about $5 \times 10^{-6}$ Torr, the auxiliary valves 1132, 1133 and the outflow valves 1117–1121 are closed.

Referring now to an example of forming a light-receiving layer on the cylindrical substrate 1137, $SiH_4/He$ gas from the gas bomb 1102, $GeH_4/He$ gas from the gas bomb 1103, NO gas from the gas bomb 1104 are permitted flow into the mass-flow controllers 1107, 1108, 1109, respectively, by opening the valves 1122, 1123 and 1124 and controlling the pressures at the outlet pressure gauges 1127, 1128, 1129 to 1 $Kg/cm^2$ and opening gradually the inflow valves 1112, 1113 and 1114, respectively. Subsequently, the outflow valves 1117, 1118, 1119 and the auxiliary valve 1132 are gradually opened to permit respective gases to flow into the reaction chamber 1101. The outflow valves 1117, 1118, 1119 are controlled so that the flow rate ratio of $SiH_4/He$, $GeH_4/He$ and NO gases may have a desired value and opening of the main valve 1134 is also controlled while watching the reading on the vacuum indicator 1136 so that the pressure in the reaction chamber 1101 may reach a desired value. And, after confirming that the temperature of the substrate 1137 is set at 50°–400° C. by the heater 1138, the power source 1140 is set at a desired power to excite glow discharge in the reaction chamber 1101, and at the same time depth profiles of germanium atoms and oxygen atoms contained in the layer formed are controlled by carrying out the operation to change gradually the flow rates of $GeH_4/He$ gas and NO gas according to the change rate curve previously designed by operation of the valves 1118 and 1120 manually or according to an externally driven motor, etc.

As described above, a first layer region (G) is formed on the substrate 1137 to a desired layer thickness by maintaining the glow discharge for a desired period of time. At the stage when the first layer region (G) is formed to a desired thickness, following the same conditions and the procedure except for completely closing the outflow valve 1118 and changing the discharging conditions, if desired, glow discharging is maintained for a desired period of time, whereby a second layer region (S) containing substantially no germanium atom can be formed on the first layer region (G).

For incorporating a substance (C) for controlling the conductivity into the first layer region (G) and the second layer region (S), gases such as $B_2H_6$, $PH_3$ and the like may be added to the gases to be introduced into the deposition chamber 1101 during formation of the first layer region (G) and the second layer region (S).

During layer formation, it is desirable to rotate the substrate 1137 at a constant speed by the motor 1139 in order to effect layer formation uniformly.

The present invention is further illustrated by referring to the following Examples.

EXAMPLE 1

By means of the device shown in FIG. 17, Samples of image forming members for electrophotography (Samples No. 11-1-17-6) (Table 2) were prepared, respectively, on cylindrical aluminum substrates under the conditions shown in Table 1.

Figure 18:
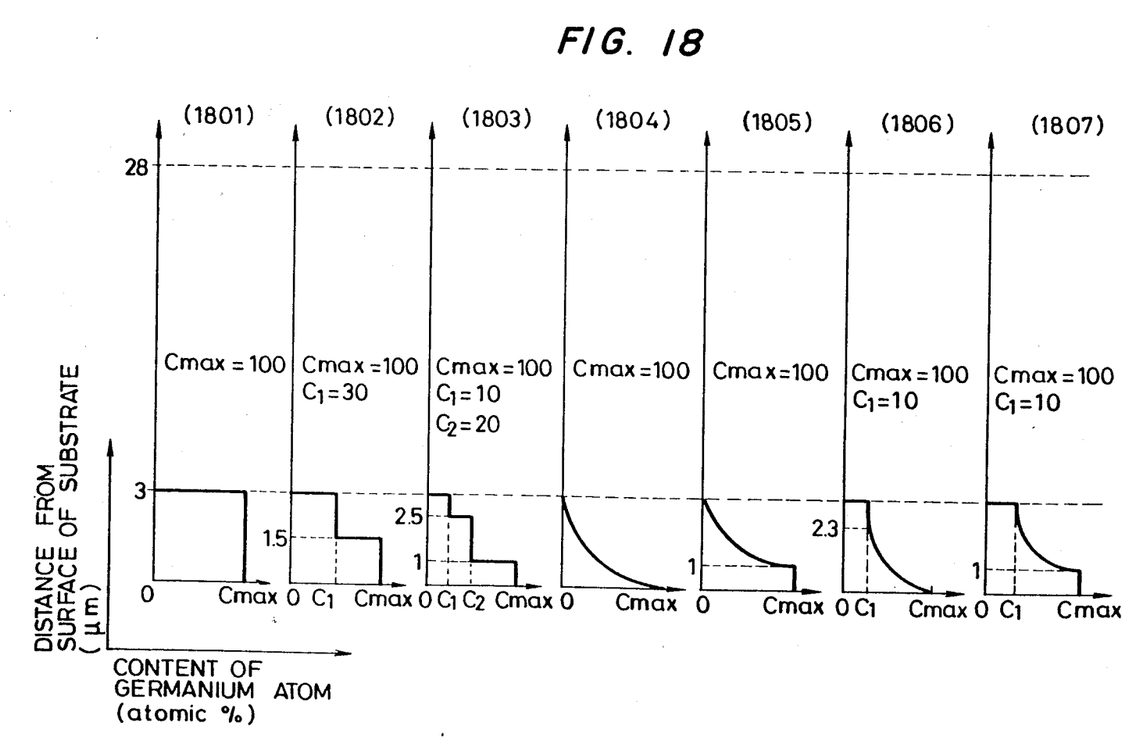
FIGS. 18 and 19 each shows a distribution of the respective atoms in Examples of the present invention.
Figure 19:
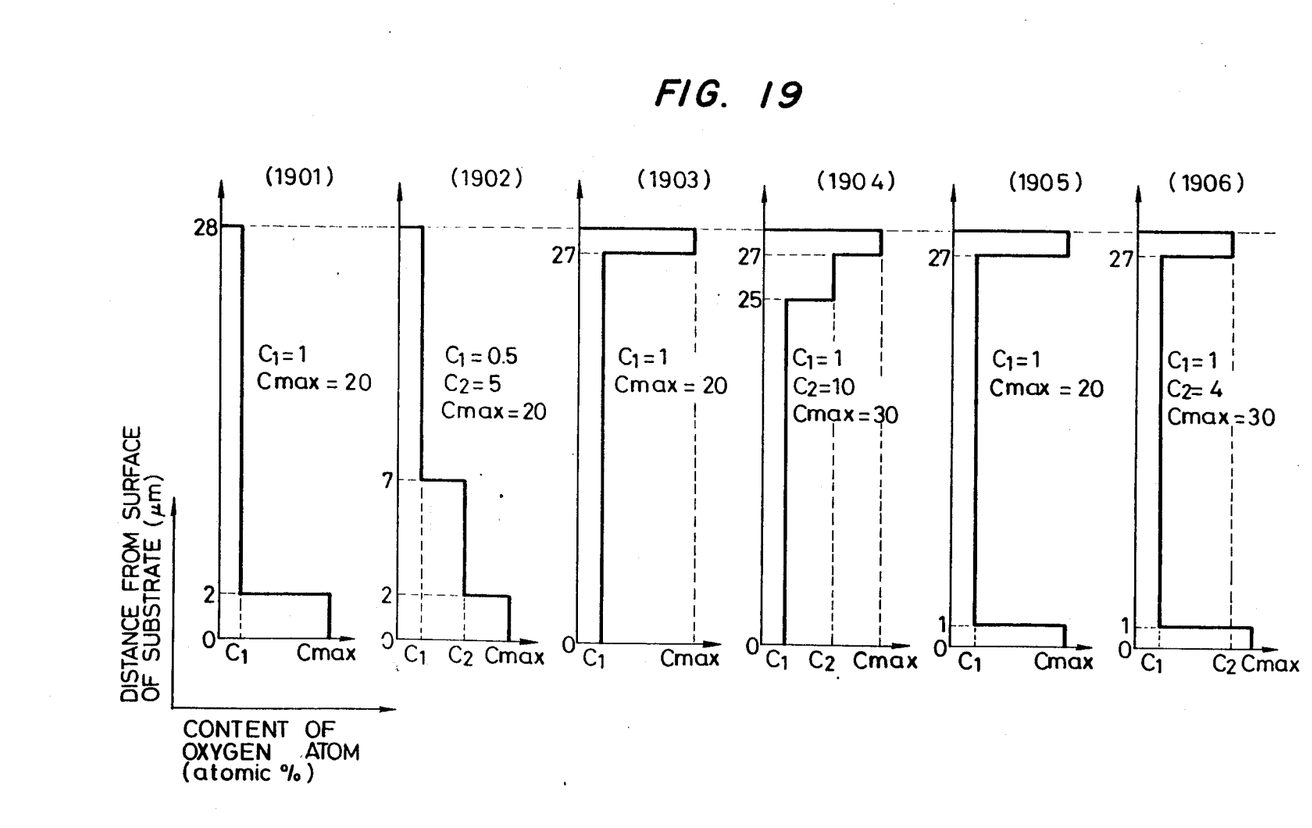

The depth profiles of germanium atoms in respective samples are shown in FIG. 18, and those of oxygen atoms is FIG. 19.

Each of the samples thus obtained was set in a charging-exposure testing device and subjected to corona charging at $\oplus 5.0$ KV for 0.3 sec., followed immediately by irradiation of a light image. The light image was irradiated by means of a tungsten lamp light source at a dose of 2 lux sec through a transmission type test chart.

Immediately thereafter, $\ominus$ chargeable developer (containing toner and carrier) was cascaded on the surface of the image forming member to give a good toner image on the surface of the image forming member. When the toner image was transferred onto a transfer paper by corona charging of $\oplus 5.0$ KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 2

By means of the device shown in FIG. 17, Samples of image forming members for electrophotography (Samples No. 21-1-27-6) (Table 4) were prepared, respectively, on cylindrical aluminum substrates under the conditions shown in Table 3.

The depth profiles of germanium atoms in respective samples are shown in FIG. 18, and those of oxygen atoms in FIG. 19.

For each of these samples, the same image evaluation test was conducted as in Example 1 to give a toner transferred image of high quality in each sample. Also, for each sample, usage test repeated for 200,000 times was performed under the environment of 38° C. and 80% RH. As the result, no lowering in image quality was observed in each sample.

TABLE 1

| Layer constitution | Gases employed | Flow rate (SCCM) | Flow rate ratio | Discharging power (W/cm$^2$) | Layer forming speed (Å/sec) | Layer thickness (μm) |
|---|---|---|---|---|---|---|
| Layer (I) | $SiH_4/He = 0.5$ $GeH_4/He = 0.5$ NO | $SiH_4 + GeH_4 = 200$ | — | 0.18 | 15 | 5 |
| Layer (II) | $SiH_4/He = 0.$ NO | $SiH_4 = 200$ | — | 0.18 | 15 | 23 |

TABLE 2

| Depth profile of O Sample No. | Depth profile of Ge | | | | | | |
|---|---|---|---|---|---|---|---|
| | 1801 | 1802 | 1803 | 1804 | 1805 | 1806 | 1807 |
| 1901 | 11-1 | 12-1 | 13-1 | 14-1 | 15-1 | 16-1 | 17-1 |

TABLE 2-continued

| Depth profile of O Sample No. | Depth profile of Ge | | | | | | |
|---|---|---|---|---|---|---|---|
| | 1801 | 1802 | 1803 | 1804 | 1805 | 1806 | 1807 |
| 1902 | 11-2 | 12-2 | 13-2 | 14-2 | 15-2 | 16-2 | 17-2 |
| 1903 | 11-3 | 12-3 | 13-3 | 14-3 | 15-3 | 16-3 | 17-3 |
| 1904 | 11-4 | 12-4 | 13-4 | 14-4 | 15-4 | 16-4 | 17-4 |
| 1905 | 11-5 | 12-5 | 13-5 | 14-5 | 15-5 | 16-5 | 17-5 |
| 1906 | 11-6 | 12-6 | 13-6 | 14-6 | 15-6 | 16-6 | 17-6 |

TABLE 3

| Layer constitution | Gases employed | Flow rate (SCCM) | Flow rate ratio | Discharging power (W/cm$^2$) | Layer forming speed (Å/sec) | Layer thickness (μm) |
|---|---|---|---|---|---|---|
| Layer (I) | SiH$_4$/He = 0.5<br>GeH$_4$/He = 0.5<br>NO<br>B$_2$H$_6$/He = 10$^{-3}$ | SiH$_4$ + GeH$_4$ = 200 | — | 0.18 | 15 | 3 |
| Layer (II) | SiH$_4$/He = 0.5<br>NO | SiH$_4$ = 200 | — | 0.18 | 15 | 28 |

TABLE 4

| Depth profile of O Sample No. | Depth profile of Ge | | | | | | |
|---|---|---|---|---|---|---|---|
| | 1801 | 1802 | 1803 | 1804 | 1805 | 1806 | 1807 |
| 1901 | 21-1 | 22-1 | 23-1 | 24-1 | 25-1 | 26-1 | 27-1 |
| 1902 | 21-2 | 22-2 | 23-2 | 24-2 | 25-2 | 26-2 | 27-2 |
| 1903 | 21-3 | 22-3 | 23-3 | 24-3 | 25-3 | 26-3 | 27-3 |
| 1904 | 21-4 | 22-4 | 23-4 | 24-4 | 25-4 | 26-4 | 27-4 |
| 1905 | 21-5 | 22-5 | 23-5 | 24-5 | 25-5 | 26-5 | 27-5 |
| 1906 | 21-6 | 22-6 | 23-6 | 24-6 | 25-6 | 26-6 | 27-6 |

I claim:

1. A photoconductive member comprising a support for photoconductive member and a light-receiving layer provided on said support having a layer constitution in which a layer region (G) comprising an amorphous material containing germanium atoms and at least one of hydrogen and halogen atoms and a layer region (S) exhibiting photoconductivity comprising an amorphous material containing silicon atoms and at least one of hydrogen and halogen atoms are successively provided from the support side, said light-receiving layer having a first layer region (1), a third layer region (3) and a second layer region (2), each containing oxygen atoms, with the distribution concentration in the layer thickness direction of C(1), C(3), and C(2), respectively, in the order mentioned from the support side, provided that when C(3) cannot be solely the maximum, and either one of C(1) and C(2) is 0, the other two are not 0 and not equal; when C(3) is 0, the other two are not 0; or when one of C(1), C(2) and C(3) is zero, C(1), C(2) and C(3) are not equal simultaneously and C(3) is not solely the maximum.

2. A photoconductive member according to claim 1, wherein hydrogen atoms are contained in at least one of the layer region (G) and the layer region (S).

3. A photoconductive member according to claim 1, wherein halogen atoms are contained in at least one of the layer region (G) and the layer region (S).

4. A photoconductive member according to claim 1, wherein germanium atoms are distributed ununiformly in the layer region (G).

5. A photoconductive member according to claim 1, wherein germanium atoms are distributed uniformly in the layer region (G).

6. A photoconductive member according to claim 1, wherein a substance (C) for controlling conductivity is contained in the light-receiving layer.

7. A photoconductive member according to claim 6, wherein the substance (C) for controlling conductivity is an atom belonging to the group III of the periodic table.

8. A photoconductive member according to claim 6, wherein the substance (C) for controlling conductivity is an atom belonging to the group V of the periodic table.

9. A photoconductive member according to claim 1, wherein silicon atoms are contained in the layer region (G).

10. A photoconductive member according to claim 1, wherein germanium atoms are contained in the layer region (G) in a depth profile in the layer thickness direction which is more enriched on the side of the support.

11. A photoconductive member according to claim 1, wherein germanium atoms are contained in the layer region (G) in a depth profile in the layer thickness direction which is more enriched on the side opposite to the side where the support is provided.

12. A photoconductive member according to claim 1, wherein the amount of germanium atoms contained in the layer region (G) is 1 to $1.0 \times 10^6$ atomic ppm.

13. A photoconductive member according to claim 1, wherein the layer region (G) has a layer thickness of 30 Å to 50μ.

14. A photoconductive member according to claim 1, wherein the layer region (S) has a layer thickness of 0.5 to 90μ.

15. A photoconductive member according to claim 1, wherein there is the relationship between the layer thickness $T_B$ of the layer region (G) and the layer thickness T of the layer region (S) of $T_B/T \leq 1$.

16. A photoconductive member according to claim 1, wherein 0.01 to 40 atomic % of hydrogen atoms are contained in the layer region (G).

17. A photoconductive member according to claim 1, wherein 0.01 to 40 atomic % of halogen atoms are contained in the layer region (S).

18. A photoconductive member according to claim 1, wherein 0.01 to 40 atomic % of hydrogen atoms and halogen atoms as the total are contained in the layer region (G).

19. A photoconductive member according to claim 7, wherein the atom belonging to the group III of the periodic table is selected from B, Al, Ga, In and Tl.

20. A photoconductive member according to claim 8, wherein the atom belonging to the group V of the periodic table is selected from P, As, Sb and Bi.

21. A photoconductive member according to claim 1, wherein the light-receiving layer has a layer region (PN) containing a substance (C) for controlling conductivity.

22. A photoconductive member according to claim 25, wherein the content of the substance (C) for controlling conductivity contained in the layer region (PN) is 0.01 to $5 \times 10^4$ atomic ppm.

23. A photoconductive member according to claim 21, wherein the layer region (PN) is provided on the support side of the light-receiving layer.

24. A photoconductive member according to claim 21, wherein the layer region (PN) is provided as the end portion layer region (E) on the support side of the light-receiving layer.

25. A photoconductive member according to claim 1, wherein 1 to 40 atomic % of hydrogen atoms are contained in the layer region (S).

26. A photoconductive member according to claim 1, wherein 1 to 40 atomic % of halogen atoms are contained in the layer region (S).

27. A photoconductive member according to claim 1, wherein 1 to 40 atomic % of hydrogen atoms and halogen atoms as the total are contained in the layer region (S).

28. A photoconductive member according to claim 1, wherein the layer thickness of the third layer region comprises 1/5 or more of the layer thickness of the light-receiving layer.

29. A photoconductive member according to claim 1, wherein the first layer region has a layer thickness of 0.003 to $30\mu$.

30. A photoconductive member according to claim 1, wherein the second layer region has a layer thickness of 0.003 to $30\mu$.

31. A photoconductive member according to claim 1, wherein the third layer region has a layer thickness of 1 to $100\mu$.

32. A photoconductive member according to claim 1, wherein the maximum concentration of C(1), C(2) and C(3) is 67 atomic % or less based on the sum of silicon atoms, germanium atoms and oxygen atoms.

33. A photoconductive member according to claim 1, wherein the minimum concentration of C(1), C(2) and C(3) is 1 atomic % or more based on the sum of silicon atoms, germanium atoms and oxygen atoms.

* * * * *